(12) United States Patent
Ouchi

(10) Patent No.: US 8,351,050 B2
(45) Date of Patent: Jan. 8, 2013

(54) WAVEFRONT-ABERRATION-MEASURING DEVICE AND EXPOSURE APPARATUS

(75) Inventor: Chidane Ouchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 461 days.

(21) Appl. No.: 12/683,141

(22) Filed: Jan. 6, 2010

(65) Prior Publication Data

US 2010/0177323 A1 Jul. 15, 2010

(30) Foreign Application Priority Data

Jan. 9, 2009 (JP) ................. 2009-003230

(51) Int. Cl.
*G01B 11/02* (2006.01)
*G01B 9/02* (2006.01)
(52) U.S. Cl. ...................... 356/515; 356/520
(58) Field of Classification Search .................. 356/515, 356/520, 521
See application file for complete search history.

(56) References Cited

U.S. PATENT DOCUMENTS

| | | | | |
|---|---|---|---|---|
| 6,573,997 B1 * | 6/2003 | Goldberg et al. | ............. | 356/521 |
| 7,081,962 B2 * | 7/2006 | Nakauchi | ................. | 356/521 |
| 7,283,252 B2 * | 10/2007 | Kato | ................. | 356/515 |
| 2005/0117170 A1 | 6/2005 | Hasegawa | | |

FOREIGN PATENT DOCUMENTS

| | | | |
|---|---|---|---|
| DE | 102 60 985 A1 | 5/2004 |
| EP | 1536287 A2 | 6/2005 |
| EP | 1844490 A1 | 10/2007 |
| JP | 2005-159213 A | 6/2005 |
| JP | 2006-332586 A | 12/2006 |
| JP | 2007-234685 A | 9/2007 |
| JP | 2008-198799 A | 8/2008 |
| WO | 2006115292 A1 | 11/2006 |
| WO | 2007100144 A1 | 9/2007 |

* cited by examiner

*Primary Examiner* — Michael A Lyons
(74) *Attorney, Agent, or Firm* — Canon USA, Inc., IP Division

(57) ABSTRACT

A wavefront-aberration-measuring device measures wavefront aberration of a to-be-tested optical system and includes a diffraction grating that splits light transmitted through the optical system, a detecting unit that detects interference fringes produced by beams of the split light, an arithmetic unit that calculates the wavefront aberration from the detected interference fringes, an image-side mask insertable into and retractable from an image plane of the optical system, and an illuminating unit that incoherently illuminates the image-side mask. The image-side mask has an aperture with a diameter larger than $\lambda/2NA$, where $\lambda$ denotes a wavelength of the illuminating unit and NA denotes a numerical aperture of the to-be-tested optical system. The arithmetic unit calculates the wavefront aberration of the optical system from the interference fringes detected with the image-side mask being retracted from the image plane and the interference fringes detected with the image-side mask being in the image plane.

6 Claims, 6 Drawing Sheets

WAVEFRONT-ABERRATION-MEASURING DEVICE AND EXPOSURE APPARATUS

BACKGROUND OF THE INVENTION

1. Field of the Invention

The present invention relates to wavefront-aberration-measuring devices and exposure apparatuses.

2. Description of the Related Art

To photolithographically manufacture semiconductor devices and the like, projection exposure apparatuses are typically used in each of which a pattern formed on a reticle is transferred to a wafer by exposure through a projection optical system. With a demand for semiconductor devices having finer circuit patterns, commercialization of projection exposure apparatuses employing extreme ultraviolet (EUV) light having a wavelength of about 5 to 20 nm, which is shorter than the wavelength of ultraviolet light, has been under consideration.

To accurately transfer patterns on reticles to exposure targets at specific magnifications, projection optical systems are required to have high imaging performance with less aberration. With the demand for semiconductor devices having finer circuit patterns, transfer performance is becoming more sensitive to aberrations caused by projection optical systems. Therefore, wavefront aberrations caused by projection optical systems need to be measured accurately.

Exemplary techniques for accurately measuring wavefront aberrations of projection optical systems for EUV apparatuses include a point diffraction interferometer (PDI) and a shearing interferometer. Shearing interferometers do not require highly advanced alignment technology compared with PDIs.

A well-known technique of a shearing interferometer intended for wavefront aberration measurement is disclosed in Japanese Patent Laid-Open No. 2005-159213, in which a spherical wave that is output from a single pinhole provided in an object plane of an optical system to be tested (hereinafter referred to as to-be-tested optical system) is made to enter the to-be-tested optical system. The wavefront of light output from the to-be-tested optical system is deformed with aberration caused by the to-be-tested optical system. In addition, a diffraction grating provided below the to-be-tested optical system splits the light output from the to-be-tested optical system into diffracted beams of different orders. In general, in a shearing interferometer of this type, such as the one disclosed in Japanese Patent Laid-Open No. 2005-159213, since diffracted beams having intensities sufficient for measurement need to be produced through the single pinhole provided in the object plane, the pinhole needs to be illuminated with high illuminance. Therefore, light from a high-brightness light source needs to be collected into the pinhole.

Examples of such a light source currently available in general include an undulator light source provided in an electron storage ring. Undulator light sources, however, are of very large sizes and are therefore not practical for use in assembly lines and installation sites of exposure apparatuses. Considering such a situation, it is desirable that an exposure light source having a small size be also used as a light source for wavefront measurement. Such a configuration is realized in Japanese Patents Laid-Open No. 2006-332586 and No. 2007-234685, for example. Specifically, a number of pinholes or apertures are provided in the object plane in a specific arrangement, whereby the efficiency of light utilization is improved. Consequently, wavefront aberration caused by the projection optical system can be measured with a shearing interferometer and with a low-brightness light source, such as a plasma light source, intended for exposure.

In a typical shearing interferometer, light transmitted through a to-be-tested optical system contains a wavefront aberration caused by the to-be-tested optical system. Moreover, when the light is diffracted by a diffraction grating, another wavefront aberration is added. Hereinafter, the wavefront aberration caused by the diffraction grating is referred to as diffraction-grating aberration. Diffraction-grating aberration occurs because light incident on the diffraction grating is not composed of parallel beams but convergent or divergent beams, and because of errors in the orientation of the diffraction grating and manufacturing errors in the periodicity of the diffraction grating.

Diffraction-grating aberration leads to errors in measurement of the wavefront aberration of a to-be-tested optical system. To realize highly accurate wavefront aberration measurement, such diffraction-grating aberration needs to be eliminated. An exemplary calibration technique applicable to the shearing interferometer disclosed in Japanese Patent Laid-Open No. 2006-332586 is disclosed in Japanese Patent Laid-Open No. 2008-198799, in which a number of extremely small pinholes are provided in the image plane so that light transmitted through the pinholes is diffracted and produces spherical waves free from aberration.

It is expected that there will be a demand for projection optical systems of exposure apparatuses having large numerical apertures (NA) with increasingly finer transfer patterns. Accordingly, the diameter of the pinholes that produce spherical waves as disclosed in Japanese Patent Laid-Open No. 2008-198799 will become extremely small so as to realize a large NA. In general, a pinhole that produces an aberration-free spherical wave from light transmitted therethrough is considered to have a diameter expressed as $D \leq \lambda/(2NA)$. If NA is 0.3 and the wavelength $\lambda$ is 13.5 nm, D is 22.5 nm or smaller. It is not easy to manufacture pinholes of such a small size. Besides, the ratio of the thickness of the pinhole to the diameter of the pinhole, i.e., the aspect ratio, becomes large, resulting in a low transmittance of the pinhole. This is disadvantageous in that a sufficient amount of light for wavefront measurement cannot be produced. Consequently, the wavefront aberration of the to-be-tested optical system cannot be measured with high accuracy.

SUMMARY OF THE INVENTION

The present invention provides a wavefront-aberration-measuring device capable of measuring the wavefront aberration of a to-be-tested optical system with high accuracy without providing on the image side very small pinholes producing spherical waves, and also provides an exposure apparatus including the measuring device.

According to an aspect of the present invention, a wavefront-aberration-measuring device measures wavefront aberration of a to-be-tested optical system. The device includes a diffraction grating arranged to split light transmitted through the to-be-tested optical system, a detecting unit arranged to detect interference fringes produced by interference between beams of the light split by the diffraction grating, an arithmetic unit arranged to calculate the wavefront aberration from information on the interference fringes detected by the detecting unit, an image-side mask insertable into and retractable from an image plane of the to-be-tested optical system, and an illuminating unit arranged to incoherently illuminate the image-side mask. The image-side mask has an aperture with a diameter larger than $\lambda/2NA$, where $\lambda$ denotes a wavelength of the illuminating unit and NA denotes a numerical aperture of the to-be-tested optical system. The arithmetic unit calculates the wavefront aberration of the to-be-tested optical system from information on the interference fringes detected by the detecting unit with the image-side mask being retracted from the image plane and information on the interference fringes produced by beams of the light transmitted through the aperture of the image-side mask and split by the diffraction grating, the interference fringes being detected by the detecting unit with the image-side mask being in the image plane.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
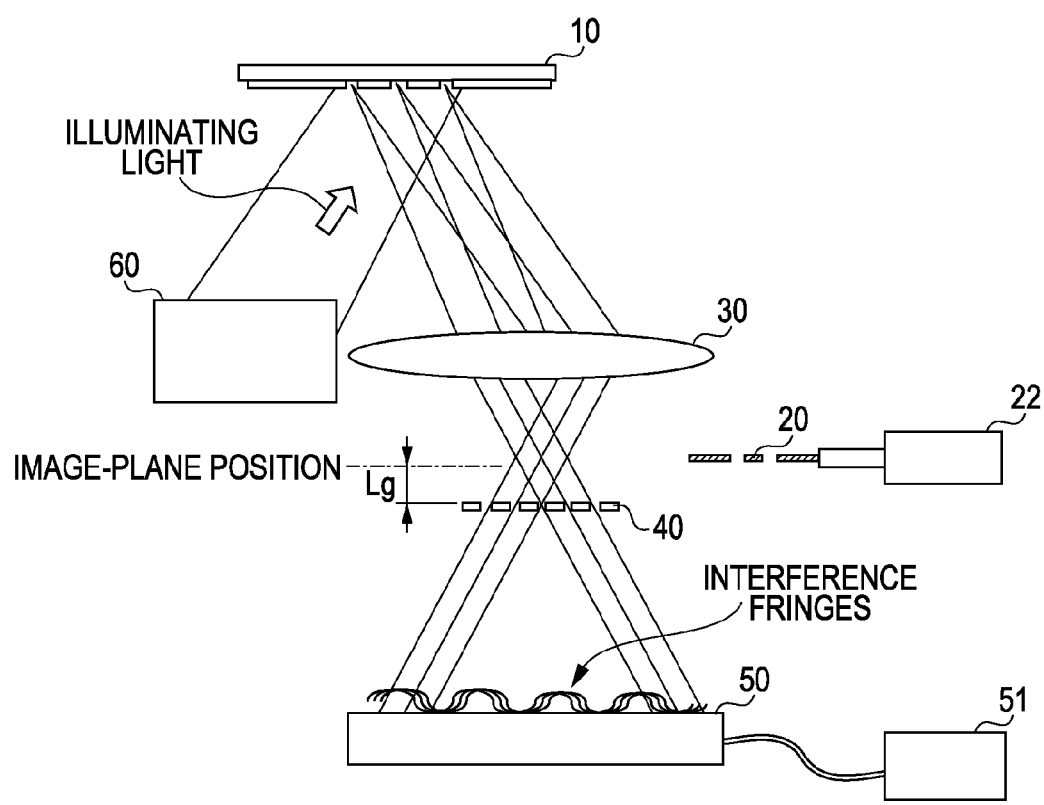
FIG. 1 shows a wavefront-aberration-measuring device.

Embodiments of the present invention will now be described in detail in accordance with the accompanying drawings.

A wavefront-aberration-measuring device according to a general embodiment of the present invention is a shearing interferometer and includes an aberration-measuring mask, a diffraction grating, and an image-side mask. The aberration-measuring mask is provided in an object plane of a to-be-tested optical system and having a plurality of apertures. The diffraction grating splits measuring light traveling through the aberration-measuring mask and the to-be-tested optical system. The image-side mask is insertable into and retracted from an image plane of the to-be-tested optical system.

The split beams of the measuring light are superposed with each other with horizontal shifts (shear) on a detector, thereby forming interference fringes. By providing the diffraction grating on the downstream side with respect to the image plane of the to-be-tested optical system and at such a position that the Talbot effect is produced, a number of clear interference fringes are produced on the detector. The pattern of the interference fringes produced in this manner is Fourier-transformed, whereby the wavefront aberration is calculated.

In the Fourier transform algorithm, unlike in the phase shifting algorithm, a wavefront can be reconstructed from a single image of interference fringes. Therefore, a phase-shifting mechanism is not necessary, and the configuration of the measuring device can be simplified. The reconstruction of a wavefront by the Fourier transform algorithm is performed as follows. First, an image of interference fringes is two-dimensionally Fourier-transformed into a frequency map. Subsequently, portions of the frequency map near a carrier frequency are extracted and are coordinate-transformed such that the carrier frequency is at the origin. The coordinate-transformed map is further inversely Fourier-transformed, whereby a complex-amplitude map is obtained. A phase component extracted from the complex-amplitude map is a so-called differential wavefront. Detailed description of Fourier transform is given in "Optical Shop Testing Second Edition" by Daniel Malacara, 13.5 Fourier Analysis of Interferograms on page 491.

The general embodiment employs a two-dimensional diffraction grating. Hence, two carrier frequencies appear on the frequency map: a carrier fringe extending in one direction (the X direction) and a carrier fringe extending in a direction (the Y direction) perpendicular to the X direction. Accordingly, two differential wavefronts, i.e., an X differential wavefront and a Y differential wavefront, are obtained. There are several methods of reconstructing a wavefront from differential wavefronts. An exemplary method is specifically disclosed in Japanese Patent Laid-Open No. 2007-234685.

A reconstructed wavefront W1 obtained as described above contains not only the wavefront of the light transmitted through the to-be-tested optical system but also an error caused by the diffraction grating, i.e., diffraction-grating aberration. Therefore, the aberration of the measured wavefront is calibrated by eliminating the diffraction-grating aberration in the following manner.

A mask (an image-side mask) is placed at a position (on the image side) where an image is formed by the to-be-tested optical system. The image-side mask is movable into and out of the optical path of the to-be-tested optical system. An illuminating unit provided for illumination of the image-side mask incoherently illuminates an aperture of the image-side mask with a numerical aperture larger than or equal to the numerical aperture of the to-be-tested optical system. Therefore, the aperture forms an incoherent surface light source that illuminates the diffraction grating.

An incoherent surface light source is equivalent to a plurality of incoherent point light sources densely provided within a surface. Accordingly, a pattern of interference fringes produced on the detector, arranged to detect interference fringes and provided at a downstream position with respect to the diffraction grating, becomes the same as a pattern of interference fringes produced by a number of incoherent spherical waves diffracted by the diffraction grating and superposed with each other in terms of intensity. Therefore, when wavefront measurement is performed in such a situation, a wavefront W0 having only the diffraction-grating aberration is obtained.

Since the wavefront W1 has both the wavefront aberration of the to-be-tested optical system and the diffraction-grating aberration, a wavefront W of the to-be-tested optical system in which the diffraction-grating aberration is calibrated is expressed as W1-W0.

In this specification, the calculation or measurement of wavefront aberration refers to the calculation or measurement of information on the wavefront aberration, not only the wavefront aberration itself. This also applies to the calculation or measurement of diffraction-grating aberration.

Exemplary embodiments of the present invention will now be described with reference to the accompanying drawings.

First Exemplary Embodiment

A wavefront-aberration-measuring device according to a first exemplary embodiment arranged to measure the wavefront aberration of a to-be-tested optical system will be described with reference to FIGS. 1 and 2.

FIG. 1 shows the measuring device in a state where a wavefront W1 produced as a combination of a wavefront W having aberration of a to-be-tested optical system 30 and a wavefront W0 having diffraction-grating aberration is measured. In the measuring device shown in FIG. 1, wavefront-aberration measurement is performed with an image-side mask 20 being retracted from an optical path by a moving mechanism 22. The wavefront W1 measured in this manner contains the wavefront W having aberration of the to-be-tested optical system 30 and the wavefront W0 having diffraction-grating aberration. That is, a relationship of W1=W+W0 holds.

Figure 2:
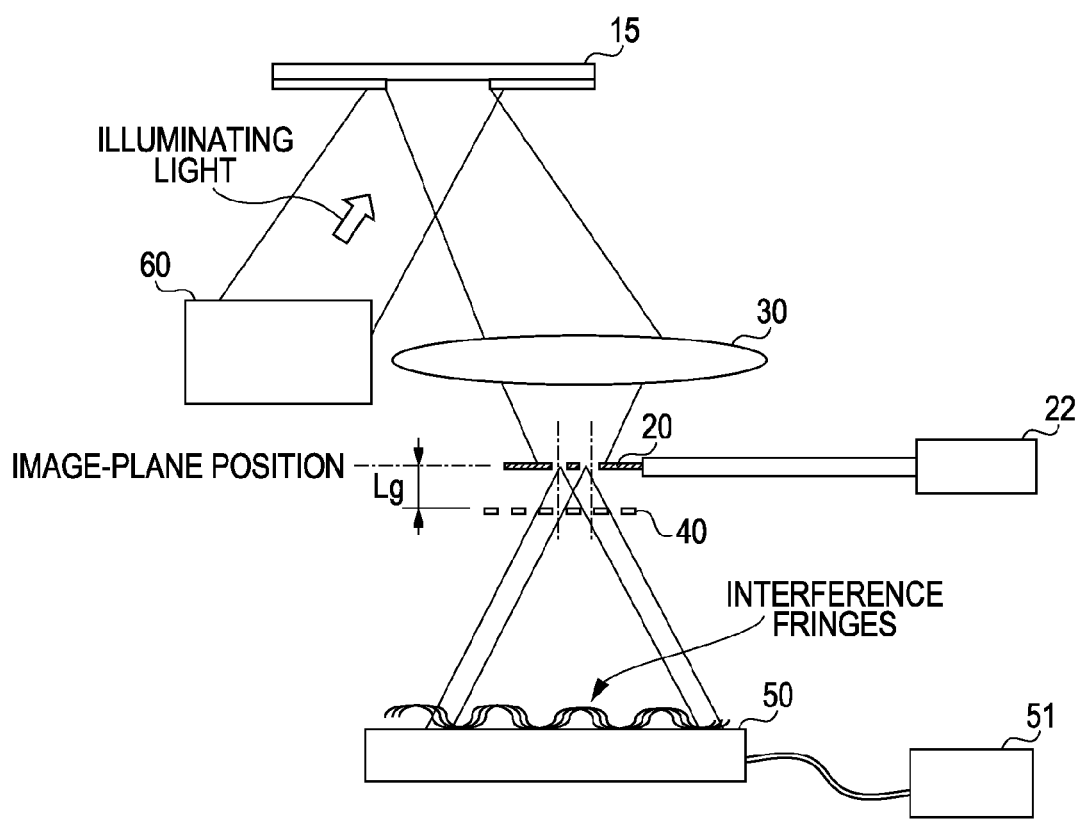
FIG. 2 shows the wavefront-aberration-measuring device in a state where diffraction-grating aberration is measured.

FIG. 2 shows the measuring device in a state where the wavefront W0 having diffraction-grating aberration is measured. When the wavefront W0 having diffraction-grating aberration is measured, the image-side mask 20 is inserted into an image plane of the to-be-tested optical system 30 by the moving mechanism 22, the image plane being between the to-be-tested optical system 30 and a diffraction grating 40. The wavefront measured in this state contains only the wavefront W0 having diffraction-grating aberration.

The measurement of the wavefront W1, i.e., a combination of the wavefront W having the aberration of the to-be-tested optical system 30 and the wavefront W0 having the diffraction-grating aberration, will now be described. Details are disclosed in Japanese Patents Laid-Open No. 2006-332586 and No. 2007-234685.

Figure 3:
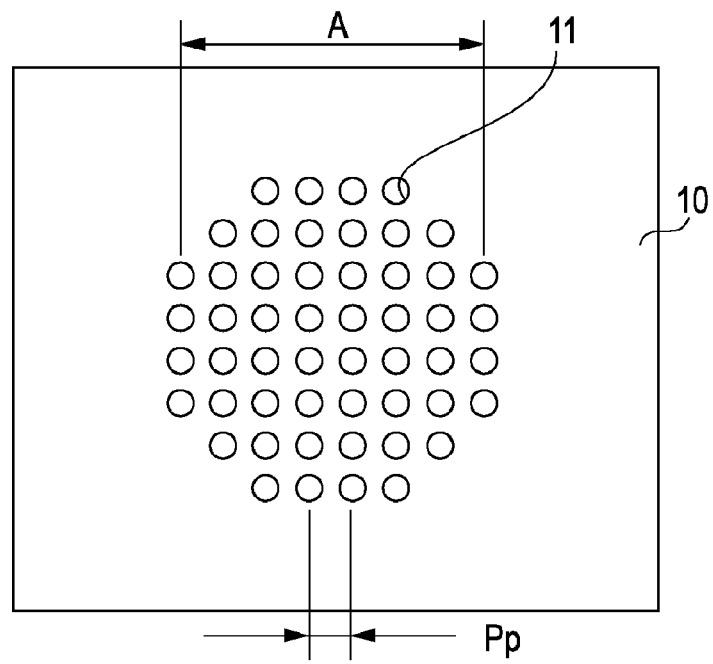
FIG. 3 shows an aberration-measuring mask seen from an illuminating side.

An aberration-measuring mask 10 is provided in an object plane of the to-be-tested optical system 30. The aberration-measuring mask 10 has a plurality of apertures 11 functioning as optical members that reflect and output light. FIG. 3 shows the arrangement of the apertures 11 of the aberration-measuring mask 10 seen from an illuminating side. A diameter A of a region in which the apertures 11 are arranged is set to 200 μm, with which the to-be-tested optical system 30 is considered to have substantially uniform amount of aberration.

Each of the apertures 11 may be either a pinhole having such a diameter that the wavefront of diffracted light produced by the pinhole, when illuminated, forms a spherical wave free from aberration as disclosed in Japanese Patent Laid-Open No. 2006-332586, or an aperture having a large diameter as disclosed in Japanese Patent Laid-Open No. 2007-234685. In the case where the aperture 11 is a pinhole, diffracted light from the pinhole is considered to form a spherical wave free from aberration if a relationship of D≦λ/(2NA) is satisfied, where D denotes the diameter of the pinhole, NA denotes the numerical aperture, and λ denotes the wavelength of diffracted light.

If the to-be-tested optical system 30 has an NA of 0.3 on the image-plane side and a magnification of ¼, the NA on the incidence side of the to-be-tested optical system 30 is 0.075. In this case, supposing that the wavelength λ of the illuminating light is 13.5 nm, a region corresponding to a diffraction angle defined by the foregoing conditions can be covered by aberration-free diffracted light if the diameter of the pinhole is 13.5/(2×0.075)=90 nm or smaller.

When the diameter of the pinhole is reduced, the intensity of the resulting diffracted light is also reduced. Therefore, it is desirable that the diameter of the pinhole be as large as possible but within a range in which only allowable aberration occurs. Hereinafter, the wavelength of the illuminating light is 13.5 nm, unless otherwise specified.

An illuminator 60 illuminates the entirety of the apertures 11 of the aberration-measuring mask 10. A reflecting surface is provided on the backside of the apertures 11. The reflecting surface reflects light, thereby generating a plurality of radiant beams. The radiant beams are transmitted through the to-be-tested optical system 30, thereby containing the wavefront aberration of the to-be-tested optical system 30. The radiant beams subsequently reach the diffraction grating 40.

The diffraction grating 40 is a two-dimensional diffraction grating and two-dimensionally splits light incident thereon into a plurality of diffracted beams of different orders. In FIG. 1, diffracted beams produced by the diffraction grating 40 other than those of the 0th-order are not shown.

The diffracted beams of different orders produced by the diffraction grating 40 travel in respective directions slightly different from each other and reach a detector (detecting unit) 50 that detects interference fringes. On the detector 50, the diffracted beams are superposed with each other with horizontal shifts, thereby interfering with each other and forming so-called shearing interference fringes.

The detector 50 is a charge-coupled-device (CCD) sensor of a backside-illumination type or a camera. To obtain interference fringes with high contrast, a distance Lg between the image plane of the to-be-tested optical system 30 and the diffraction grating 40 satisfies Expression (1) below called a Talbot condition:

$$Lg = m \cdot Pg^2/\lambda \qquad (1)$$

where Pg denotes the grating period of the diffraction grating 40, λ denotes the wavelength of the measuring light (illuminating light), m denotes a positive integer other than zero. The reason why m is not zero is to produce a fine pattern called a carrier in the resulting interference fringes and thus enable wavefront reconstruction by Fourier transform mentioned above.

The ratio of a diffraction angle θ=λ/Pg to a value twice the numerical aperture NA of the to-be-tested optical system 30, i.e., a shear ratio θ/(2×NA), is desirably about 0.01 to 0.05 from experience. In the first exemplary embodiment, the shear ratio is set to 0.023 with an NA of 0.3 and a diffraction-grating period Pg of 1 μm.

Shearing interference fringes occur regardless of whether the diffraction grating 40 is provided on the upstream side or on the downstream side with respect to the image plane of the to-be-tested optical system 30. Considering that the aberration caused by the diffraction grating 40 is to be measured by inserting the image-side mask 20 into the image plane as described below, the diffraction grating 40 needs to be provided on the downstream side with respect to the image plane.

An interval Pp between each pair of adjacent apertures 11 is set to a value larger than or equal to the spatial coherence length of the illuminating light. Therefore, beams reflected by the different apertures 11 do not interfere with each other. Accordingly, a number of interference fringes produced on the detector 50 by the beams from the apertures 11 can be superposed with each other simply in terms of intensity. Thus, sufficient light intensity can be obtained on the detector 50 even if the density of beams of the illuminating light falling onto the apertures 11 is low.

Moreover, if the interval Pp between the apertures 11 satisfies Expression (2) below and thus the positions of light and dark interference fringes produced by different apertures 11 are the same as each other, an interference pattern having intensity sufficient for measurement can be obtained without deteriorating the contrast of the interference fringes:

$$Pp = Pg/\beta \qquad (2)$$

where β denotes the magnification of the to-be-tested optical system 30.

In the case where the apertures 11 are pinholes, a plurality of groups of pinholes may be arranged at the interval Pp so as to further improve the efficiency of light utilization.

An arithmetic unit 51 acquires information on the interference fringes detected by the detector 50 and performs wavefront reconstruction by Fourier transform. The wavefront W1 acquired here contains the wavefront W having the aberration of the to-be-tested optical system 30 and the wavefront W0 having the diffraction-grating aberration, as described above.

The measurement of the diffraction-grating aberration in the wavefront W0 will now be described with reference to FIG. 2. To measure the diffraction-grating aberration in the wavefront W0, the image-side mask 20 is inserted into the image plane of the to-be-tested optical system 30 by the moving mechanism 22, the image plane being between the to-be-tested optical system 30 and the diffraction grating 40.

Figure 4:
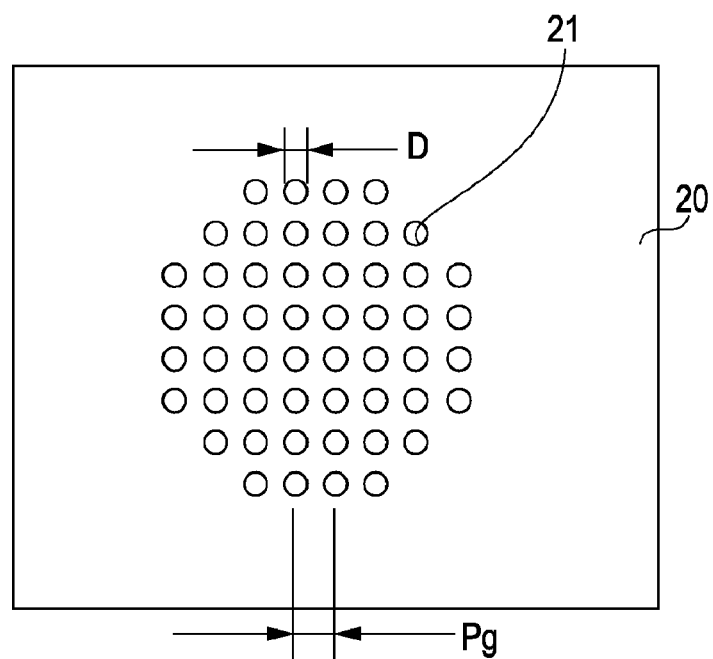
FIG. 4 shows an exemplary configuration of an image-side mask.

FIG. 4 shows an exemplary configuration of the image-side mask 20. The image-side mask 20 has a plurality of apertures 21 that transmit and output light. The image-side mask 20 is of a transmissive type and is a metal self-supported film made of nickel or the like having a high optical absorptance with through holes provided therein. The image-side mask 20 may have only a single aperture 21. In the first exemplary embodiment, a plurality of apertures 21 are periodically arranged for improved efficiency of light utilization. The period of the arrangement is the same as the grating period Pg, whereby beams of light output from the individual apertures 21 produce, on the detector 50, respective patterns of interference fringes whose positions of light and dark fringes are the same as each other. Thus, an interference pattern having sufficient intensity can be obtained without deteriorating the contrast thereof.

The wavefront-aberration-measuring device of the first exemplary embodiment utilizes the interference between the 0th-order diffracted beam and the 1st-order diffracted beam and between the 0th-order diffracted beam and the −1st-order diffracted beam.

Figure 5:
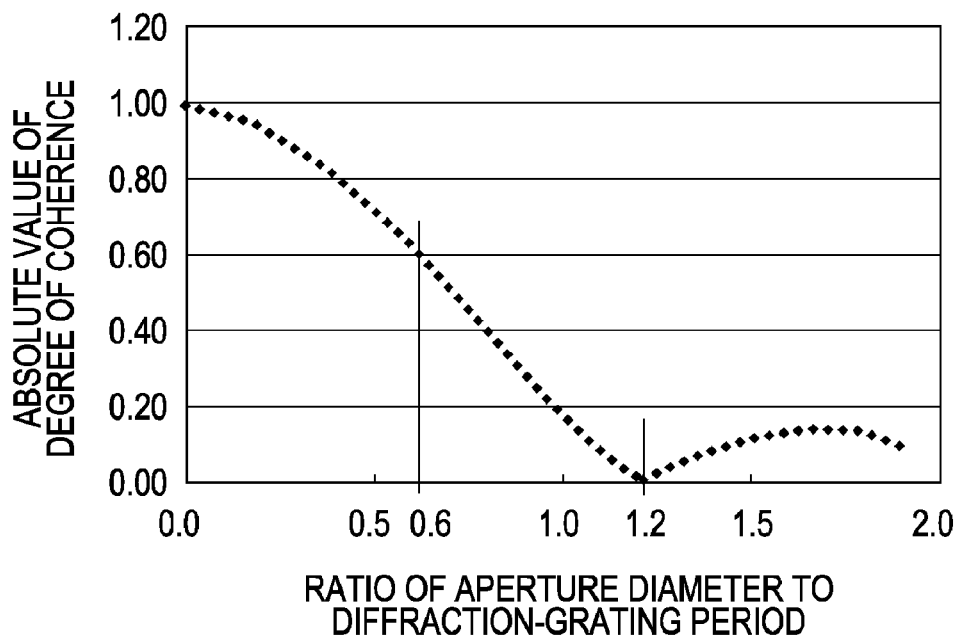
FIG. 5 shows the relationship between the ratio of a diameter of an aperture to a period of a diffraction grating and the absolute value of the degree of coherence between a 0th-order diffracted beam and a 1st-order diffracted beam.

FIG. 5 shows the relationship between the ratio of the diameter D of a single aperture 21 to the period Pg of the diffraction grating 40, represented by the horizontal axis, and the absolute value of the degree of coherence between the 0th-order diffracted beam and the 1st-order (or −1st-order) diffracted beam, represented by the vertical axis. The relationship is calculated from a relationship representing the degree of coherence of illuminating light from an incoherent light source, which is known as the theorem of van Cittert-Zernike, and the diffraction angle of the 1st-order diffracted beam produced by the diffraction grating 40.

Referring to FIG. 5, when the ratio (D/Pg) of the diameter D of the aperture 21 to the period Pg of the diffraction grating 40 is 1.2, the degree of coherence is 0, which means no interference. Therefore, the diameter D of the aperture 21 needs to be smaller than 1.2 times the period Pg of the diffraction grating 40. If the diameter D is made smaller than the period Pg, the degree of coherence becomes closer to 1, and the contrast of the interference fringes is improved. If, however, the diameter D is extremely small, it becomes difficult to provide the aperture 21 and the efficiency of light utilization is reduced. Consequently, it disadvantageously takes a long time for measurement.

Desirably, the diameter D is 100 nm or larger. With such a diameter, the aperture 21 can be easily provided in a self-supported film. Moreover, with the diameter D being larger than or equal to the thickness of a self-supported film, the attenuation of light occurring when the light passes through the aperture 21 becomes small. In contrast, if the diameter D of the aperture 21 is increased to a value substantially equal to the period Pg of the diffraction grating 40, the degree of coherence between diffracted beams of different orders is reduced, and consequently the contrast of the interference fringes is reduced. Therefore, in the first exemplary embodiment, the diameter D of the aperture 21 is set to 0.6 times the period Pg of the diffraction grating 40 so that a sufficient amount of light and interference fringes with a contrast of 0.6 can be obtained.

In the first exemplary embodiment intended for application to a projection exposure apparatus, the illuminating unit provided for incoherent illumination of the image-side mask 20 is configured such that the burden imposed on the exposure apparatus is lightened as much as possible. Specifically, the illuminating unit includes an object-side light radiator capable of radiating incoherent light to the object position of the to-be-tested optical system 30. The object-side light radiator includes an object-side mask 15 and the illuminator 60 (an object-side illuminator). The object-side mask 15 has an object-side light-radiating portion 16 that reflects light incident thereon toward the to-be-tested optical system 30. The illuminator 60 illuminates the object-side light-radiating portion 16. To measure only the diffraction-grating aberration in the wavefront W0, the illuminating unit provided for incoherent illumination of the image-side mask 20 may illuminate the image-side mask 20 either through or without the to-be-tested optical system 30.

Figure 6:
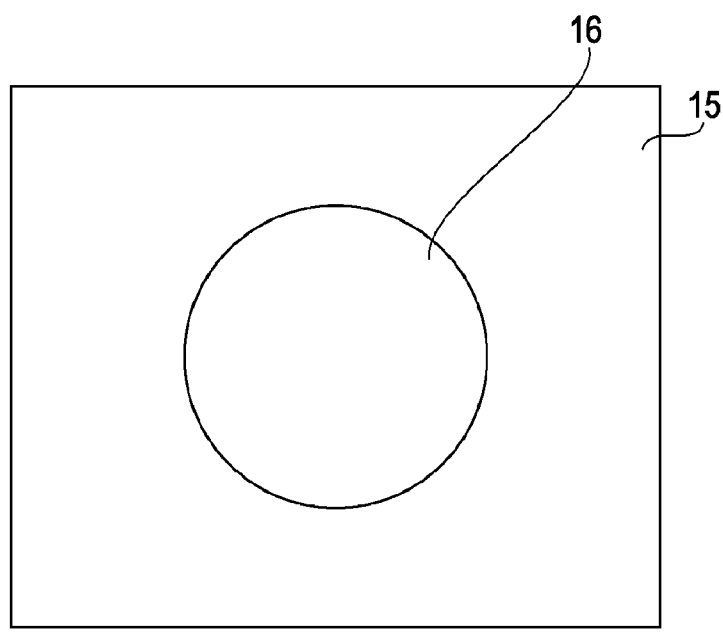
FIG. 6 shows an object-side mask.

FIG. 6 shows the object-side mask 15. The incoherent light radiated by the object-side light-radiating portion 16 travels through the to-be-tested optical system 30 and falls onto the apertures 21 of the image-side mask 20. The diameter of the object-side light-radiating portion 16 is set to 200 μm, which is the same as the diameter A of the region within which the apertures 11 are arranged. If the numerical aperture of the illuminator 60 is larger than or equal to the incidence-side numerical aperture of the to-be-tested optical system 30, the object-side light-radiating portion 16 can be provided as a simple, fixed, plane mirror. In the first exemplary embodiment, however, for convenience in the application to an exposure apparatus, an illumination optical system of the exposure apparatus also functions as the illuminator 60.

According to "Kogaku No Genri III (Principles of Optics III)" (M. Born and E. Wolf, Tokai University Press), if an object plane is incoherently illuminated and Expression (3) below (corresponding to Expression (13) in 10.5.1 in the aforementioned book) is satisfied, an image plane is incoherently illuminated regardless of the aberration of an imaging optical system:

$$\rho' \gg 0.13 r'_A \quad (3)$$

where ρ' denotes the image size, and $r'_A$ denotes the radius of a first dark ring in an Airy pattern produced by the imaging optical system and is expressed as 0.61λ/NA.

In the first exemplary embodiment, NA is 0.3 and λ is 13.5 nm. Therefore, $r'_A$ is 27 nm. The value of ρ' is the product of the diameter 200 μm of the object-side light-radiating portion 16 and the magnification ¼ of the to-be-tested optical system 30, i.e., 50 μm. Thus, Expression (1) is sufficiently satisfied. If the object-side light-radiating portion 16 is incoherently illuminated, the group of the apertures 11 is regarded as an incoherent surface light source. Therefore, by performing wavefront measurement in this situation, a wavefront having only the diffraction-grating aberration, without the wavefront of the to-be-tested optical system 30, is obtained.

In a typical exposure apparatus, the ratio (denoted by a) of the numerical aperture of the illumination optical system to the incidence-side numerical aperture of the projection optical system is about 0.8. Therefore, if the object-side light-radiating portion 16 is configured as a simple plane mirror, radiant beams that are sufficiently incoherent and correspond to a σ=1 cannot be obtained from the object-side light-radiating portion 16.

To solve this, one of or a combination of the following three solutions is employed in the first exemplary embodiment. A first solution is as follows. The object-side mask 15, which is provided on the surface thereof with a pattern of projections and depressions having specific slopes in advance, is moved within a plane by a length larger than or equal to the period of the pattern during the integral action time (integration time) of the detector 50. In this case, the maximum slope is set to larger than or equal to the difference between the incidence-side numerical aperture 0.075 of the to-be-tested optical system 30 and the numerical aperture 0.06 of the illuminator 60, i.e., 0.015 radians or larger. Thus, the radiant light covers the entirety of the entrance pupil of the to-be-tested optical system 30.

A second solution is as follows. The object-side mask 15 is moved during the integral action time of the detector 50 such that the illuminating light from the illuminator 60 is incident on the to-be-tested optical system 30 at an angle larger than or equal to the difference between the incidence-side numerical aperture of the to-be-tested optical system 30 and the numerical aperture of the illuminator 60. That is, the object-side mask 15 is moved by an angle of 0.015 radians or larger during the integral action time of the detector 50. Thus, the radiant light covers the entirety of the entrance pupil of the to-be-tested optical system 30.

A third solution is as follows. The illuminator 60 changes the incident angle of the illuminating light by an angle larger than or equal to the difference between the incidence-side numerical aperture of the to-be-tested optical system 30 and the numerical aperture of the illuminator 60 during the integral action time of the detector 50. That is, the angle of the illuminating light from the illuminator 60 is changed by an angle of 0.015 radians or larger during the integral action time of the detector 50. Thus, the radiant light covers the entirety of the entrance pupil of the to-be-tested optical system 30.

The arithmetic unit 51 subtracts the wavefront W0 measured in the state shown in FIG. 2 from the wavefront W1 measured in the state shown in FIG. 1, whereby only the aberration in the wavefront W of the to-be-tested optical system 30 can be obtained. Once the calculated diffraction-grating aberration in the wavefront W0 is stored in the arithmetic unit 51, there is no need to measure the wavefront W0 for each measurement of the to-be-tested optical system 30 unless the diffraction grating 40 is changed.

Thus, diffraction-grating aberration alone can be measured with high accuracy even if the image-side mask 20 does not have very small pinholes each having a diameter of λ/(2NA) or smaller. With reference to the diffraction-grating aberration, the wavefront aberration of the to-be-tested optical system 30 can be calculated with high accuracy.

While FIGS. 1 and 2 each schematically show the to-be-tested optical system 30 as a single optical element, in the case where the to-be-tested optical system 30 is a projection optical system of an EUV exposure apparatus, the to-be-tested optical system 30 usually includes 6 to 8 mirrors.

To summarize, according to the first exemplary embodiment, the wavefront aberration of a to-be-tested optical system can be measured with high accuracy without providing, on the image side, very small pinholes producing spherical waves.

Second Exemplary Embodiment

Figure 7:
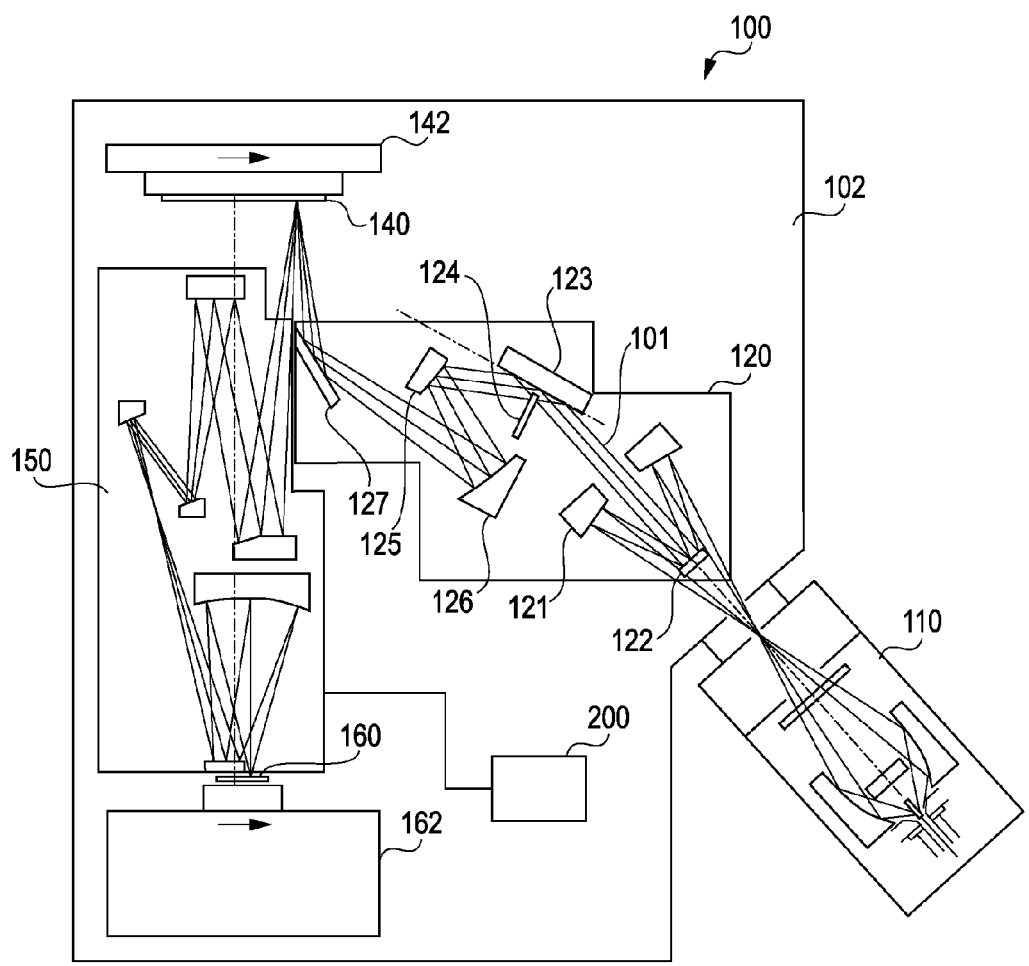
FIG. 7 shows an exposure apparatus in a state where exposure is performed.

A second exemplary embodiment of the present invention will now be described with reference to FIGS. 7 and 8. The second exemplary embodiment concerns an exposure apparatus. FIG. 7 shows an exposure apparatus 100 in a state where exposure is performed. The exposure apparatus 100 is a projection exposure apparatus arranged to expose a wafer 160 to EUV light and transfer a circuit pattern formed on a mask to the wafer 160. In the exposure apparatus 100, the EUV light from an EUV light source 110 is used as exposure light. The exposure apparatus 100 includes an illumination optical system 120, a mask stage 142 on which a mask (reticle) 140 is to be placed, a projection optical system (to-be-tested optical system) 150, and a wafer stage 162 on which the wafer 160 is to be placed.

Since EVU light has low transmittance in the atmosphere, the illumination optical system 120 and other constituents are housed in a vacuum housing 102 as shown in FIG. 7.

The EUV light source 110, which oscillates EUV light, is of a discharge-produced-plasma type in which plasma is produced by creating a discharge in Xe gas or Sn steam, for example, whereby EUV light is generated. Alternatively, the EUV light source 110 may be of a laser-produced-plasma type in which a convergent beam of high-power pulsed laser is applied to Xe or Sn, whereby plasma is produced.

The illumination optical system 120 illuminates the mask 140 with the EUV light caused to propagate therein. The illumination optical system 120 of the second exemplary embodiment includes a parallel-conversion optical system, an integrator 123, and an aperture stop 124.

The parallel-conversion optical system includes a concave mirror 121 and a convex mirror 122 and converts the EUV light received from the EUV light source 110 into parallel rays 101. The integrator 123 has, for example, a plurality of cylindrical reflecting surfaces or a fly-eye- or fish-scale-like reflecting surface, thereby uniformly illuminating the mask 140 with a specific NA value.

The aperture stop 124 is provided above the reflecting surface of the integrator 123 such that the aperture surface of the aperture stop 124 is substantially perpendicular to the reflecting surface. The aperture stop 124 defines the shape in which effective light sources are distributed and also defines the angular distribution of rays illuminating different points on the mask 140, which is a surface to be illuminated.

An optical system including a convex mirror 125 and a concave mirror 126 collects (concentrates) the rays from the integrator 123 into an arc-shaped region.

A plane mirror 127 reflects the rays on the image side of the optical system including the convex mirror 125 and the concave mirror 126 upward to the mask 140, thereby causing the rays to be collected onto the object plane of the projection optical system 150 at a predetermined incident angle.

The mask 140 is of a reflective type and has a circuit pattern to be transferred. The mask 140 is supported and moved by the mask stage 142. An image of the pattern on the mask 140 is projected to the wafer (substrate) 160 by the projection optical system 150.

The mask 140 and the wafer 160 are arranged at positions optically conjugate to each other. The wafer 160 is supported and moved by the wafer stage 162, whereby exposure is performed at a desired position of the wafer 160.

The projection optical system 150 subjected to EUV light is extremely sensitive to changes in position accuracy and deformation due to heat. Therefore, the wavefront aberration needs to be measured between exposure operations. In accordance with the results of such measurements, the positions of relevant mirrors need to be adjusted, and the results of the adjustments need to be fed back. Moreover, if impurities adhere to any multilayered mirrors of the projection optical system 150 and undergo chemical changes, the phase of reflection changes and the wavefront aberration also changes. To avoid this, the wavefront aberration of the projection optical system 150 needs to be measured in the exposure apparatus itself with the wavelength intended for exposure. In this respect, the exposure apparatus 100 includes the wavefront-aberration-measuring device described in the first exemplary embodiment and therefore satisfies the foregoing needs.

The exposure apparatus 100 also includes a drive mechanism that drives the mirrors included in the projection optical system 150, and a control unit 200 that controls the drive mechanism.

Figure 8:
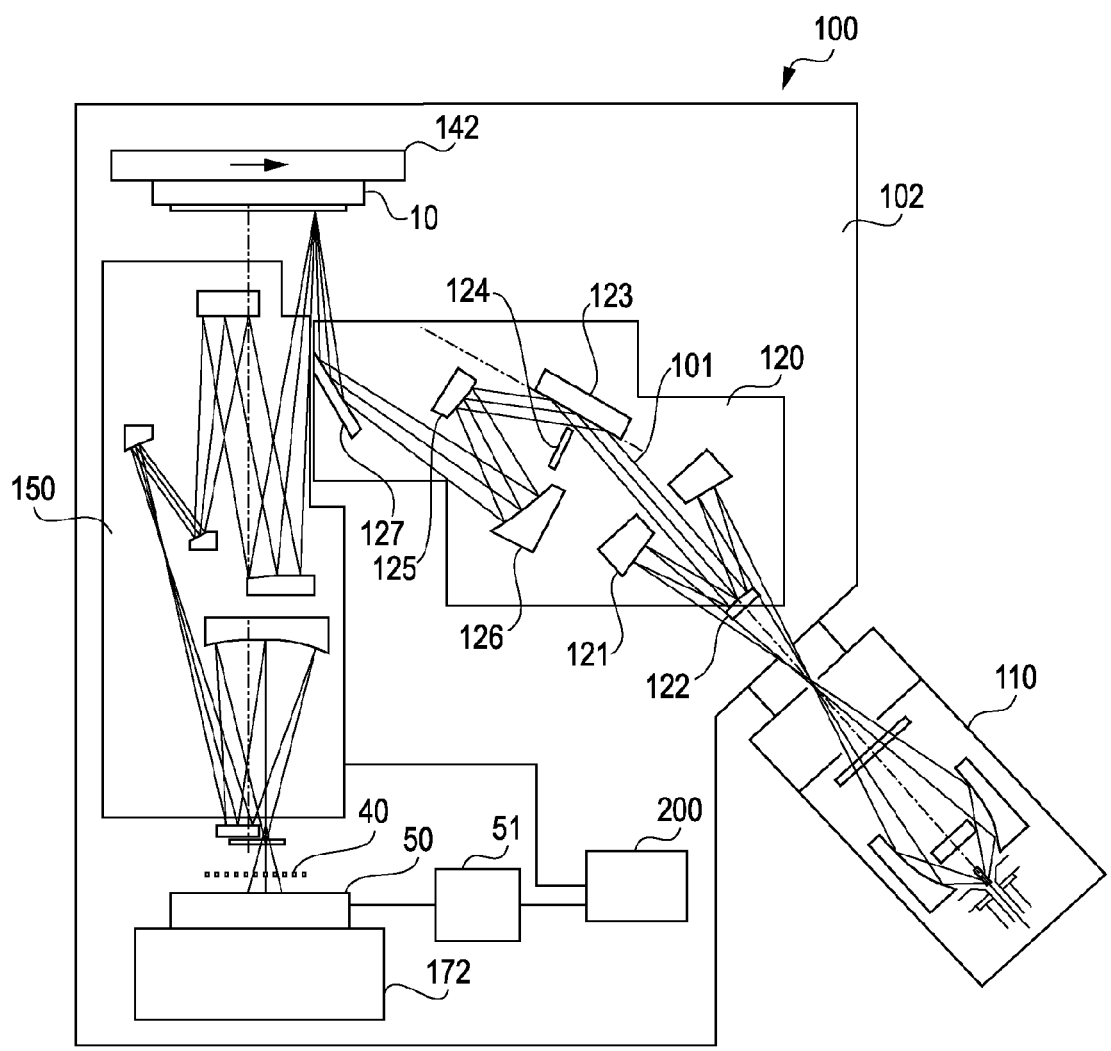
FIG. 8 shows the exposure apparatus in a state where aberration of a projection optical system is measured.

FIG. 8 shows the exposure apparatus 100 in a state where aberration of the projection optical system 150 is measured. First, the aberration-measuring mask 10 used with the measuring device described in the first exemplary embodiment is placed on the mask stage 142. The wafer stage 162 is replaced with a detecting-unit stage 172. The detecting-unit stage 172 carries the diffraction grating 40, the detector 50, the image-side mask 20 (not shown in FIG. 8), and the moving mechanism 22 (not shown in FIG. 8) thereon, and is movable to a desired measurement position relative to the projection optical system 150, which is to be tested.

The arithmetic unit 51 acquires and analyzes information on interference fringes that are measured with the image-side mask 20 being retracted from the optical path by the moving mechanism 22, thereby calculating the aberration in the wavefront W1 containing the wavefront W having the aberration of the projection optical system 150 and the wavefront W0 having the diffraction-grating aberration.

When the diffraction-grating aberration is measured, the object-side mask 15 provided for the measuring device described in the first exemplary embodiment is placed on the mask stage 142. The image-side mask 20 is inserted into the optical path by the moving mechanism 22. The arithmetic unit 51 acquires and analyzes information on interference fringes that are measured in this state, thereby calculating the wavefront W0 having the diffraction-grating aberration. By calculating the difference between the wavefront W1 and the wavefront W0 with the arithmetic unit 51, the aberration in the wavefront W of the projection optical system 150 can be obtained.

A control unit 200 acquires the information on the aberration in the wavefront W of the projection optical system 150 calculated as described above, and calculates the amounts of adjustments in the orientations of the mirrors included in the projection optical system 150. In accordance with the calculated adjustment amounts, the control unit 200 controls the drive mechanism to move the mirrors, thereby setting the projection optical system 150 so as to have reduced aberration.

To summarize, according to the second exemplary embodiment, an exposure apparatus is provided in which the wavefront aberration of a projection optical system can be measured with high accuracy without providing, on the image side, very small pinholes producing spherical waves.

Device-Manufacturing Method

A third exemplary embodiment of the present invention will now be described. The third exemplary embodiment concerns a method of manufacturing a device (a semiconductor device, a liquid crystal display device, and the like).

A semiconductor device is manufactured through a front-end process in which an integrated circuit is formed on a substrate such as a wafer, and a back-end process in which a product such as an integrated circuit chip is completed from the integrated circuit on the wafer formed in the front-end process. The front-end process includes a step of exposing the substrate coated with a photoresist to light using the exposure apparatus according to the second exemplary embodiment, and a step of developing the exposed substrate. The back-end process includes an assembly (dicing and bonding) step and a packaging (sealing) step.

A liquid crystal display device is manufactured through a process of forming a plurality of transparent electrodes. The process of forming a plurality of transparent electrodes includes a step of coating, with a photoresist, a substrate such as a glass substrate having a transparent conductive film deposited thereon, a step of exposing the substrate coated with the photoresist to light using the exposure apparatus according to the second exemplary embodiment, and a step of developing the exposed substrate.

The device-manufacturing method of the third exemplary embodiment is advantageous, compared with a known device-manufacturing method, in at least one of the performance, quality, productivity, and production cost of the device.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2009-003230 filed Jan. 9, 2009, which is hereby incorporated by reference herein in its entirety.

What is claimed is:

1. A wavefront-aberration-measuring device arranged to measure wavefront aberration of a to-be-tested optical system, the device comprising:

a diffraction grating arranged to split light transmitted through the to-be-tested optical system;

a detecting unit arranged to detect interference fringes produced by interference between beams of the light split by the diffraction grating;

an arithmetic unit arranged to calculate the wavefront aberration from information on the interference fringes detected by the detecting unit;

an image-side mask insertable into and retractable from an image plane of the to-be-tested optical system; and an illuminating unit arranged to incoherently illuminate the image-side mask, wherein the image-side mask has an aperture with a diameter larger than $\lambda/2NA$, where $\lambda$ denotes a wavelength of the illuminating unit and NA denotes a numerical aperture of the to-be-tested optical system, wherein the arithmetic unit calculates the wavefront aberration of the to-be-tested optical system from information on the interference fringes detected by the detecting unit with the image-side mask being retracted from the image plane and information on the interference fringes produced by beams of the light transmitted through the aperture of the image-side mask and split by the diffraction grating, the interference fringes being detected by the detecting unit with the image-side mask being in the image plane, wherein the illuminating unit includes
an object-side mask having an object-side light-radiating portion arranged to reflect light incident thereon toward the to-be-tested optical system; and
an object-side illuminator arranged to illuminate the object-side light-radiating portion, wherein the illuminating unit illuminates the image-side mask through the to-be-tested optical system, wherein the object-side light-radiating portion has in a surface thereof a pattern of depressions and projections whose maximum slope is at least as large as a difference between an incidence-side numerical aperture of the to-be-tested optical system and a numerical aperture of the object-side illuminator, and wherein the object-side mask is moved within a plane by a length at least as large as a period of the pattern during an integration time of the detecting unit.

2. An exposure apparatus arranged to expose a substrate to light from a light source and transfer a pattern formed on a mask to the substrate, the apparatus comprising:
    a projection optical system arranged to project an image of the pattern to the substrate; and
    the wavefront-aberration-measuring device according to claim 1, the device calculating wavefront aberration of the projection optical system by using the light from the light source.

3. A wavefront-aberration-measuring device arranged to measure wavefront aberration of a to-be-tested optical system, the device comprising:
    a diffraction grating arranged to split light transmitted through the to-be-tested optical system;
    a detecting unit arranged to detect interference fringes produced by interference between beams of the light split by the diffraction grating;
    an arithmetic unit arranged to calculate the wavefront aberration from information on the interference fringes detected by the detecting unit;
    an image-side mask insertable into and retractable from an image plane of the to-be-tested optical system; and
    an illuminating unit arranged to incoherently illuminate the image-side mask,
    wherein the image-side mask has an aperture with a diameter larger than $\lambda/2NA$, where $\lambda$ denotes a wavelength of the illuminating unit and NA denotes a numerical aperture of the to-be-tested optical system,
    wherein the arithmetic unit calculates the wavefront aberration of the to-be-tested optical system from information on the interference fringes detected by the detecting unit with the image-side mask being retracted from the image plane and information on the interference fringes produced by beams of the light transmitted through the aperture of the image-side mask and split by the diffraction grating, the interference fringes being detected by the detecting unit with the image-side mask being in the image plane,
    wherein the illuminating unit includes
        an object-side mask having an object-side light-radiating portion arranged to reflect light incident thereon toward the to-be-tested optical system; and
        an object-side illuminator arranged to illuminate the object-side light-radiating portion,
    wherein the illuminating unit illuminates the image-side mask through the to-be-tested optical system, and
    wherein the object-side mask is moved during an integration time of the detecting unit such that illuminating light from the object-side illuminator is incident on the to-be-tested optical system at an angle at least as large as the difference between an incidence-side numerical aperture of the to-be-tested optical system and a numerical aperture of the object-side illuminator.

4. An exposure apparatus arranged to expose a substrate to light from a light source and transfer a pattern formed on a mask to the substrate, the apparatus comprising:
    a projection optical system arranged to project an image of the pattern to the substrate; and
    the wavefront-aberration-measuring device according to claim 3, the device calculating wavefront aberration of the projection optical system by using the light from the light source.

5. A wavefront-aberration-measuring device arranged to measure wavefront aberration of a to-be-tested optical system, the device comprising:
    a diffraction grating arranged to split light transmitted through the to-be-tested optical system;
    a detecting unit arranged to detect interference fringes produced by interference between beams of the light split by the diffraction grating;
    an arithmetic unit arranged to calculate the wavefront aberration from information on the interference fringes detected by the detecting unit;
    an image-side mask insertable into and retractable from an image plane of the to-be-tested optical system; and
    an illuminating unit arranged to incoherently illuminate the image-side mask,
    wherein the image-side mask has an aperture with a diameter larger than $\lambda/2NA$, where $\lambda$ denotes a wavelength of the illuminating unit and NA denotes a numerical aperture of the to-be-tested optical system,
    wherein the arithmetic unit calculates the wavefront aberration of the to-be-tested optical system from information on the interference fringes detected by the detecting unit with the image-side mask being retracted from the image plane and information on the interference fringes produced by beams of the light transmitted through the aperture of the image-side mask and split by the diffraction grating, the interference fringes being detected by the detecting unit with the image-side mask being in the image plane,
    wherein the illuminating unit includes
        an object-side mask having an object-side light-radiating portion arranged to reflect light incident thereon toward the to-be-tested optical system; and
        an object-side illuminator arranged to illuminate the object-side light-radiating portion,
    wherein the illuminating unit illuminates the image-side mask through the to-be-tested optical system, and
    wherein the object-side illuminator changes an incident angle of illuminating light during an integration time of the detecting unit by an angle at least as large as the difference between an incidence-side numerical aperture of the to-be-tested optical system and a numerical aperture of the object-side illuminator.

6. An exposure apparatus arranged to expose a substrate to light from a light source and transfer a pattern formed on a mask to the substrate, the apparatus comprising:
    a projection optical system arranged to project an image of the pattern to the substrate; and
    the wavefront-aberration-measuring device according to claim 5, the device calculating wavefront aberration of the projection optical system by using the light from the light source.

* * * * *